(12) United States Patent
Takami (10) Patent No.: US 12,463,613 B2
(45) Date of Patent: Nov. 4, 2025

(54) MULTILAYER ELECTRONIC COMPONENT

(71) Applicant: TDK CORPORATION, Tokyo (JP)

(72) Inventor: Toshiyuki Takami, Tokyo (JP)

(73) Assignee: TDK CORPORATION, Tokyo (JP)

( * ) Notice: Subject to any disclaimer, the term of this patent is extended or adjusted under 35 U.S.C. 154(b) by 158 days.

(21) Appl. No.: 18/491,318

(22) Filed: Oct. 20, 2023

(65) Prior Publication Data

US 2024/0146277 A1 May 2, 2024

(30) Foreign Application Priority Data

Oct. 27, 2022 (JP) ................. 2022-172421

(51) Int. Cl.
| | | |
|---|---|---|
| *H03H 7/01* | (2006.01) | |
| *H03H 1/00* | (2006.01) | |
| *H03H 7/09* | (2006.01) | |
| *H03H 7/46* | (2006.01) | |
| *H10D 86/85* | (2025.01) | |

(52) U.S. Cl.
CPC ............ *H03H 7/0115* (2013.01); *H03H 7/09* (2013.01); *H03H 7/463* (2013.01); *H10D 86/85* (2025.01); *H03H 2001/0085* (2013.01)

(58) Field of Classification Search
CPC ......... H03H 2001/0085; H03H 7/0115; H03H 7/09; H03H 7/463

USPC ................................................ 333/175, 185
See application file for complete search history.

(56) References Cited

U.S. PATENT DOCUMENTS

| | | | |
|---|---|---|---|
| 2013/0194054 A1* | 8/2013 | Presti ................... | H04B 1/0458 |
| | | | 333/32 |
| 2015/0061791 A1 | 3/2015 | Imamura | |
| 2018/0102752 A1 | 4/2018 | Kishimoto | |
| 2019/0229698 A1* | 7/2019 | Oishi ................... | H03H 7/0115 |

FOREIGN PATENT DOCUMENTS

CN             114093849 A      2/2022

* cited by examiner

*Primary Examiner* — Rakesh B Patel
(74) *Attorney, Agent, or Firm* — Oliff PLC (57) ABSTRACT

An electronic component includes: a first inductor; a second inductor connected in parallel with the first inductor; and a stack for integrating the first inductor and the second inductor, the stack including a plurality of dielectric layers stacked together. Each of the first inductor and the second inductor is wound about an axis extending in a direction orthogonal to a stacking direction of the plurality of dielectric layers. The number of windings of the first inductor and the number of windings of the second inductor are different from each other.

7 Claims, 9 Drawing Sheets

MULTILAYER ELECTRONIC COMPONENT

CROSS REFERENCE TO RELATED APPLICATIONS

This application claims the benefit of Japanese Priority Patent Application No. 2022-172421 filed on Oct. 27, 2022, the entire contents of which are incorporated herein by reference.

BACKGROUND OF THE INVENTION

1. Field of the Invention

The present invention relates to a multilayer electronic component including two inductors.

2. Description of the Related Art

Compact mobile communication apparatuses are generally configured to use a single common antenna for a plurality of applications that use different systems and have different service frequency bands, and to use a branching filter to separate a plurality of signals received and transmitted by the antenna from each other.

A branching filter for separating a first signal of a frequency within a first frequency band and a second signal of a frequency within a second frequency band higher than the first frequency band from each other typically includes a common port, a first signal port, a second signal port, a first filter provided in a first signal path leading from the common port to the first signal port, and a second filter provided in a second signal path leading from the common port to the second signal port. As the first and second filters, LC resonators including inductors and capacitors are used, for example.

An LC resonator used for such a filter is desired to have a large Q value. To increase the Q value of the LC resonator, it is effective to increase the Q value of an inductor.

US 2015/0061791 A1 discloses a band-pass filter including a stack including a plurality of insulation layers stacked together. In this band-pass filter, an inductor constituted by alternately connecting a plurality of linear conductors and a plurality of interlayer connection conductors is used, to increase the Q value of the inductor and the Q value of an LC resonant circuit.

The recent market demands for reductions in size and footprint of the compact mobile communication apparatuses and also requires miniaturization of branching filters for use in those communication apparatuses. When branching filters are downsized, this reduces a space for arranging inductors to be used for the branching filters, which consequently makes it difficult to increase the Q value of the inductor. Meanwhile, it is considered to increase the Q value of the inductor by connecting two inductors in parallel. However, when two inductors are simply connected in parallel, the combined inductance of the two inductors decreases, which causes a problem that desired characteristics are not achieved.

The foregoing problem is not limited to branching filters and applies to multilayer electronic components in general that include two inductors.

SUMMARY OF THE INVENTION

An object of the present invention is to provide a multilayer electronic component that can achieve desired characteristics while increasing a Q value.

A multilayer electronic component of the present invention includes: a first inductor; a second inductor connected in parallel with the first inductor; and a stack for integrating the first inductor and the second inductor, the stack including a plurality of dielectric layers stacked together. Each of the first inductor and the second inductor is wound about an axis extending in a direction orthogonal to a stacking direction of the plurality of dielectric layers. The number of windings of the first inductor and the number of windings of the second inductor are different from each other.

In the multilayer electronic component of the present invention, the number of windings of the first inductor and the number of windings of the second inductor connected in parallel with the first inductor are different from each other. Thus, according to the present invention, it is possible to provide a multilayer electronic component that can achieve desired characteristics while increasing a Q value.

Other and further objects, features and advantages of the present invention will appear more fully from the following description.

DETAILED DESCRIPTION OF THE PREFERRED EMBODIMENTS

An embodiment of the present invention will now be described in detail with reference to the drawings. First, a configuration of a multilayer electronic component (hereinafter simply referred to as electronic component) 1 according to the embodiment of the present invention will be outlined with reference to FIG. 1. The electronic component 1 according to the present embodiment includes at least a first inductor and a second inductor connected in parallel with the first inductor.

Figure 1:
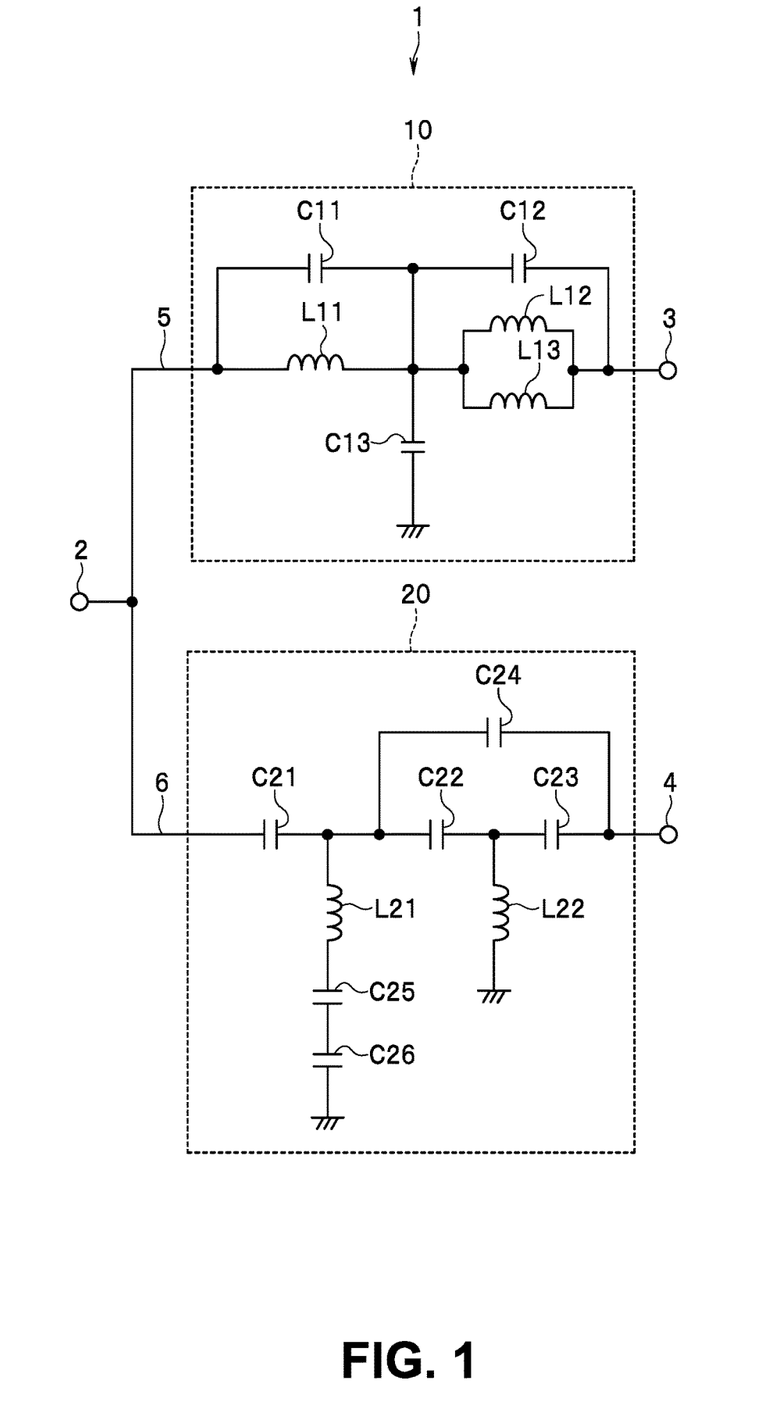
FIG. 1 is a circuit diagram showing a circuit configuration of a multilayer electronic component according to an embodiment of the present invention.

FIG. 1 shows a branching filter (diplexer) as an example of the electronic component 1 including the first and second inductors. The branching filter includes a first filter 10 that selectively passes a first signal of a frequency within a first passband, and a second filter 20 that selectively passes a second signal of a frequency within a second passband higher than the first passband.

The electronic component 1 further includes a first port 2, a second port 3, a third port 4, a signal path 5 connecting the first port 2 and the second port 3, and a signal path 6 connecting the first port 2 and the third port 4. The first filter 10 is provided between the first port 2 and the second port 3 in a circuit configuration. The second filter 20 is provided between the first port 2 and the third port 4 in the circuit configuration. In the present application, the expression of "in the (a) circuit configuration" is used to indicate not layout in a physical configuration but layout in the circuit diagram.

The signal path 5 is a path leading from the first port 2 to the second port 3 via the first filter 10. The signal path 6 is a path leading from the first port 2 to the third port 4 via the second filter 20. The first signal of a frequency within the first passband selectively passes through the signal path 5 on which the first filter 10 is provided. The second signal of a frequency within the second passband selectively passes through the signal path 6 on which the second filter 20 is provided. In such a manner, the electronic component 1 separates the first signal and the second signal.

The first and second inductors of the present invention may be provided to the first filter 10 and/or may be provided to the second filter 20. In the present embodiment, in particular, the first and second inductors are provided to the first filter 10.

Next, an example of configurations of the first and second filters 10 and 20 will be described with reference to FIG. 1. The first filter 10 will initially be described. In the example shown in FIG. 1, the first filter 10 is a low-pass filter. The first filter 10 includes inductors L11, L12, and L13 and capacitors C11, C12, and C13.

One end of the inductor L11 is connected to the first port 2. The inductors L12 and L13 are connected in parallel with each other. One end of each of the inductors L12 and L13 is connected to the other end of the inductor L11. The other end of each of the inductors L12 and L13 is connected to the second port 3.

One of the inductors L12 and L13 corresponds to the "first inductor" of the present invention. The other of the inductors L12 and L13 corresponds to the "second inductor" of the present invention. In the present embodiment, in particular, both ends of each of the inductors L12 and L13 are connected to the signal path 5.

The capacitor C11 is connected in parallel with the inductor L11. The capacitor C12 is connected in parallel with the inductors L12 and L13. One end of the capacitor C13 is connected to the other end of the inductor L11 and the one end of each of the inductors L12 and L13. The other end of the capacitor C13 is grounded.

Next, the second filter 20 will be described. In the example shown in FIG. 1, the second filter 20 is a high-pass filter. The second filter 20 includes inductors L21 and L22 and capacitors C21, C22, C23, C24, and C25.

One end of the capacitor C21 is connected to the first port 2. One end of the capacitor C22 is connected to the other end of the capacitor C21. One end of the capacitor C23 is connected to the other end of the capacitor C22. The other end of the capacitor C23 is connected to the third port 4. One end of the capacitor C24 is connected to the one end of the capacitor C22. The other end of the capacitor C24 is connected to the other end of the capacitor C23.

One end of the inductor L21 is connected to a connection point between the capacitor C21 and the capacitor C22. One end of the capacitor C25 is connected to the other end of the inductor L21. One end of the capacitor C26 is connected to the other end of the capacitor C25. The other end of the capacitor C26 is grounded.

One end of the inductor L22 is connected to a connection point between the capacitor C22 and the capacitor C23. The other end of the inductor L22 is grounded.

Figure 2:
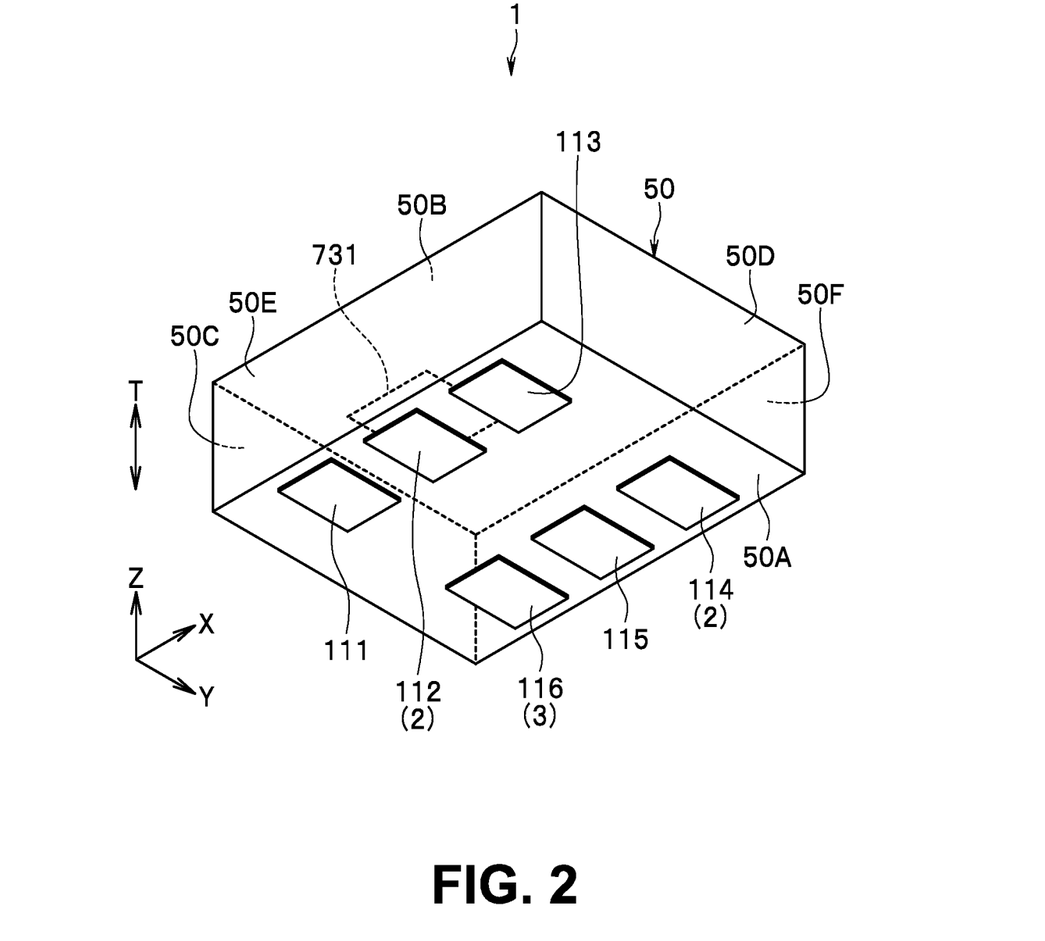
FIG. 2 is a perspective view showing the appearance of the multilayer electronic component according to the embodiment of the present invention.

Next, other configurations of the electronic component 1 will be described with reference to FIG. 2. FIG. 2 is a perspective view showing the appearance of the electronic component 1.

The electronic component 1 further includes a stack 50 including a plurality of dielectric layers and a plurality of conductors stacked together. The stack 50 is for integrating the first filter 10 including the inductors L12 and L13 and the second filter 20.

The stack 50 has a bottom surface 50A and a top surface 50B located at both ends in a stacking direction T of the plurality of dielectric layers, and four side surfaces 50C to 50F connecting the bottom surface 50A and the top surface 50B. The side surfaces 50C and 50D are opposite to each other. The side surfaces 50E and 50F are opposite to each other. The side surfaces 50C to 50F are perpendicular to the top surface 50B and the bottom surface 50A.

Here, X, Y, and Z directions are defined as shown in FIG. 2. The X, Y, and Z directions are orthogonal to one another. In the present embodiment, a direction parallel to the stacking direction T will be referred to as the Z direction. The opposite directions to the X, Y, and Z directions are defined as −X, −Y, and −Z directions, respectively. The expression of "when seen from the stacking direction T" means that an object is seen from a position away in the Z direction or the −Z direction.

As shown in FIG. 2, the bottom surface 50A is located at the end of the stack 50 in the −Z direction. The top surface 50B is located at the end of the stack 50 in the Z direction. The side surface 50C is located at the end of the stack 50 in the −X direction. The side surface 50D is located at the end of the stack 50 in the X direction. The side surface 50E is located at the end of the stack 50 in the −Y direction. The side surface 50F is located at the end of the stack 50 in the Y direction.

The electronic component 1 further includes terminals 111, 112, 113, 114, 115, and 116 provided on the bottom surface 50A of the stack 50. The terminals 111, 112, and 113 are arranged in this order in the X direction at positions closer to the side surface 50E than the side surface 50F. The terminals 114, 115, and 116 are arranged in this order in the −X direction at positions closer to the side surface 50F than the side surface 50E.

The terminal 112 is a signal terminal corresponding to the first port 2. The terminal 114 is a signal terminal corresponding to the third port 4. The terminal 116 is a signal terminal corresponding to the second port 3. The first to third ports 2 to 4 are thus provided on the bottom surface 50A of the stack 50. In the present embodiment, in particular, one of the terminals 112 and 116 corresponds to a "first signal terminal" of the present invention, and the other of the terminals 112 and 116 corresponds to a "second signal terminal" of the present invention. Each of the terminals 111, 113, and 115 is grounded.

Next, an example of the plurality of dielectric layers and the plurality of conductors constituting the stack 50 will be described with reference to FIG. 3A to FIG. 6C. In this example, the stack 50 includes twenty-three dielectric layers stacked together. The twenty-three dielectric layers will be referred to as first to twenty-third dielectric layers in the order from bottom to top. The first to twenty-third dielectric layers are denoted by reference numerals 51 to 73, respectively.

In FIG. 3A to FIG. 6A, each circle represents a through hole. The dielectric layers 51 to 71 each have a plurality of through holes. The plurality of through holes are each formed by filling a hole intended for a through hole with a conductive paste. Each of the plurality of through holes is connected to a conductor layer or another through hole. In FIG. 3A to FIG. 6A, a plurality of specific through holes of the plurality of through holes are denoted by reference numerals.

Figure 3A:
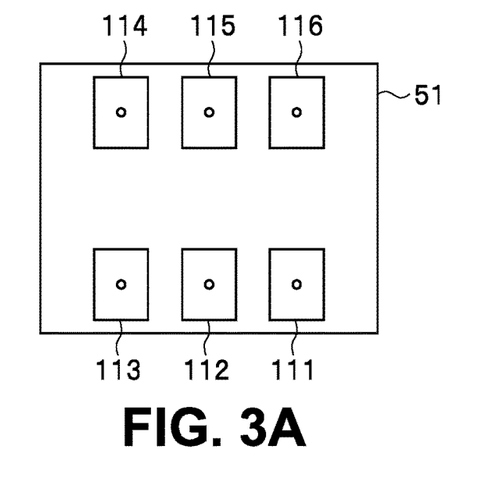
FIG. 3A to FIG. 3C are explanatory diagrams showing respective patterned surfaces of first to third dielectric layers of a stack of the multilayer electronic component according to the embodiment of the present invention.

FIG. 3A shows the patterned surface of the first dielectric layer 51. The terminals 111 to 116 are formed on the patterned surface of the dielectric layer 51.

Figure 3B:
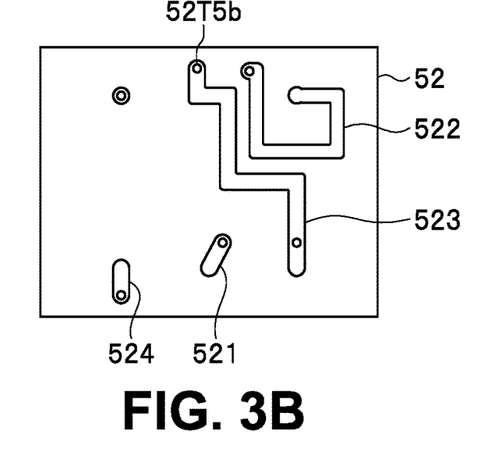

FIG. 3B shows the patterned surface of the second dielectric layer 52. Conductor layers 521, 522, 523, and 524 are formed on the patterned surface of the dielectric layer 52. A through hole denoted by a reference numeral 52T5b is connected to the conductor layer 523. Note that the through hole denoted by the reference numeral 52T5b is referred to simply as a through hole 52T5b in the following description. A through hole denoted by a reference numeral other than the through hole 52T5b is referred to similarly to the through hole 52T5b.

Figure 3C:
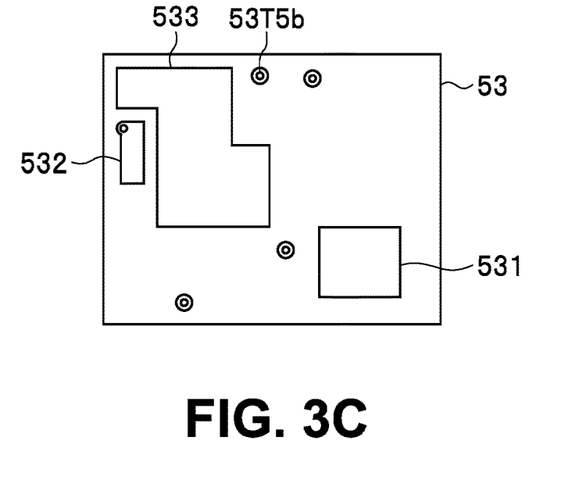

FIG. 3C shows the patterned surface of the third dielectric layer 53. Conductor layers 531, 532, and 533 are formed on the patterned surface of the dielectric layer 53. A through hole 53T5b shown in FIG. 3C is connected to the through hole 52T5b formed in the dielectric layer 52.

Figure 4A:
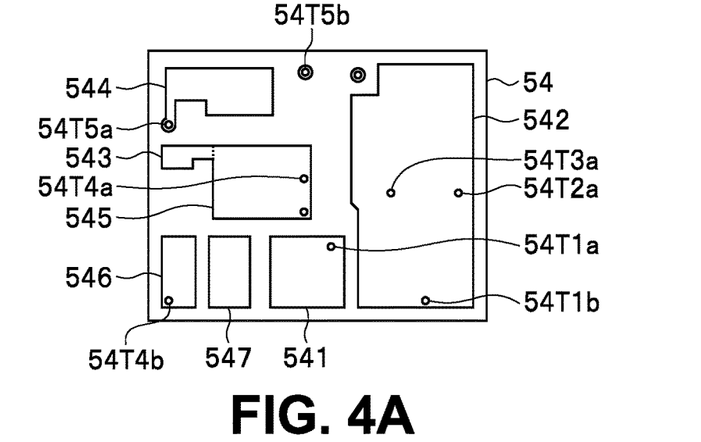
FIG. 4A is an explanatory diagram showing a patterned surface of a fourth dielectric layer of the stack of the multilayer electronic component according to the embodiment of the present invention.

FIG. 4A shows the patterned surface of the fourth dielectric layer 54. Conductor layers 541, 542, 543, 544, 545, 546, and 547 are formed on the patterned surface of the dielectric layer 54. The conductor layer 543 is connected to the conductor layer 545. In FIG. 4A, the boundary between the conductor layer 543 and the conductor layer 545 is indicated by a dotted line.

Through holes 54T1a, 54T4a, 54T4b, and 54T5a shown in FIG. 4A are connected to the conductor layers 541, 545, 546, and 544, respectively. Three through holes 54T1b, 54T2a, and 54T3a are connected to the conductor layer 542.

A through hole 54T5b is connected to the through holes 53T5b formed in the dielectric layer 53.

Figure 4B:
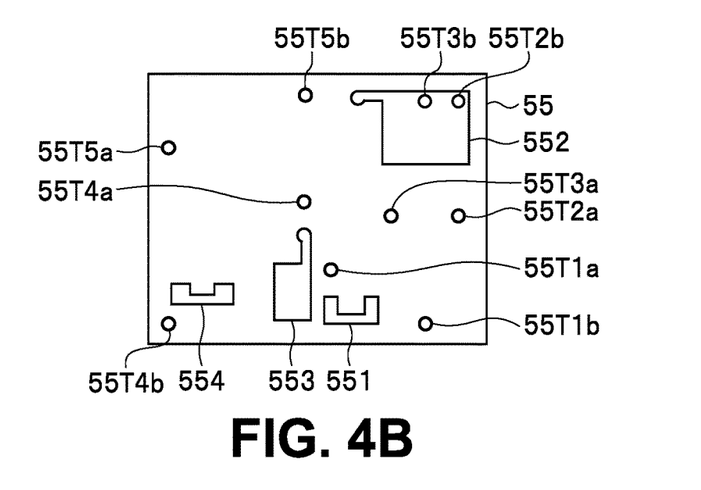
FIG. 4B is an explanatory diagram showing a patterned surface of a fifth dielectric layer of the stack of the multilayer electronic component according to the embodiment of the present invention.

FIG. 4B shows the patterned surface of the fifth dielectric layer 55. Conductor layers 551, 552, 553, and 554 are formed on the patterned surface of the dielectric layer 55.

Eight through holes 55T1a, 55T1b, 55T2a, 55T3a, 55T4a, 55T4b, 55T5a, and 55T5b shown in FIG. 4B are connected to the through holes 54T1a, 54T1b, 54T2a, 54T3a, 54T4a, 54T4b, 54T5a, and 54T5b formed in the dielectric layer 54, respectively. Two through holes 55T2b and 55T3b are connected to the conductor layer 552.

Figure 4C:
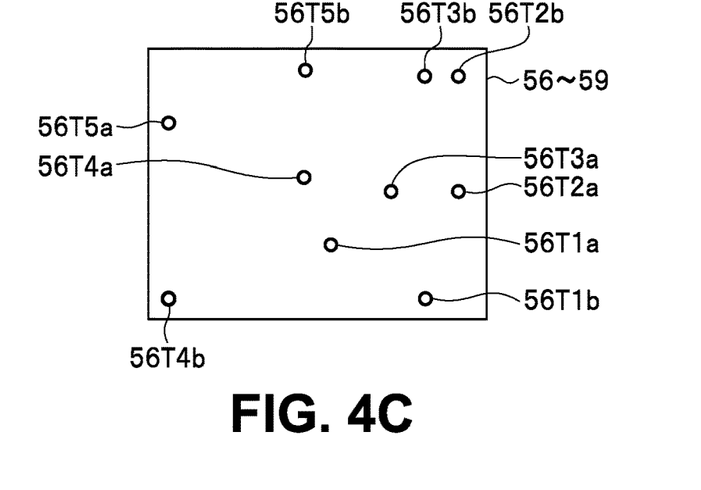
FIG. 4C is an explanatory diagram showing a patterned surface of each of sixth to ninth dielectric layers of the stack of the multilayer electronic component according to the embodiment of the present invention.

FIG. 4C shows the patterned surface of each of the sixth to ninth dielectric layers 56 to 59. The dielectric layers 56 to 59 each have ten through holes 56T1a, 56T1b, 56T2a, 56T2b, 56T3a, 56T3b, 56T4a, 56T4b, 56T5a, and 56T5b formed therein. The through holes 56T1a, 56T1b, 56T2a, 56T2b, 56T3a, 56T3b, 56T4a, 56T4b, 56T5a, and 56T5b formed in the dielectric layer 56 are connected to the through holes 55T1a, 55T1b, 55T2a, 55T2b, 55T3a, 55T3b, 55T4a, 55T4b, 55T5a, and 55T5b formed in the dielectric layer 55, respectively. In the dielectric layers 56 to 59, every vertically adjacent through holes denoted by the same reference signs are connected to each other.

Figure 5A:
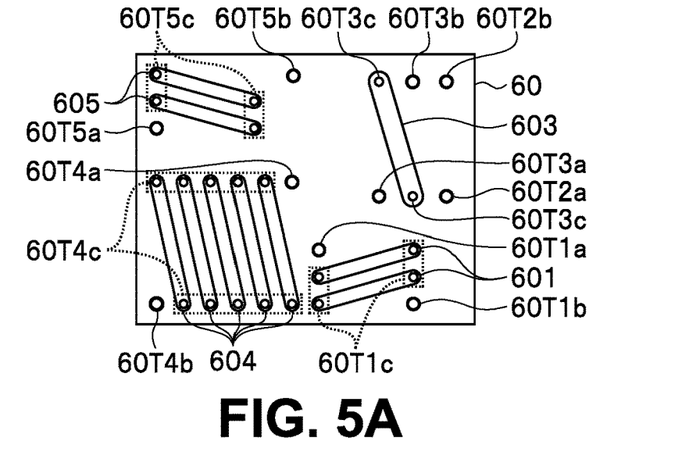
FIG. 5A is an explanatory diagram showing a patterned surface of a tenth dielectric layer of the stack of the multilayer electronic component according to the embodiment of the present invention.

FIG. 5A shows the patterned surface of the tenth dielectric layer 60. Two inductor conductor layers 601, one inductor conductor layer 603, five inductor conductor layers 604, and two inductor conductor layers 605 are formed on the patterned surface of the dielectric layer 60.

Ten through holes 60T1a, 60T1b, 60T2a, 60T2b, 60T3a, 60T3b, 60T4a, 60T4b, 60T5a, and 60T5b shown in FIG. 5A are connected to the through holes 56T1a, 56T1b, 56T2a, 56T2b, 56T3a, 56T3b, 56T4a, 56T4b, 56T5a, and 56T5b formed in the dielectric layer 59, respectively.

Each of the four through holes arranged in the frames indicated by dotted lines denoted by a reference numeral 60T1c is connected to one of the two conductor layers 601 and also connected to a portion of the connected conductor layer 601 near one end or a portion of the conductor layer 601 near the other end. Note that the through holes arranged in the frames indicated by the dotted lines denoted by the reference numeral 60T1c are referred to simply as a through hole 60T1c in the following description. A through hole arranged in a frame denoted by a reference numeral other than the reference numeral 60T1c is referred to similarly to the through hole 60T1c.

Each of two through holes 60T3c is connected to a portion of the conductor layer 603 near one end and a portion of the conductor layer 603 near the other end. Each of ten through holes 60T4c is connected to any of the five conductor layers 604 and also connected to a portion of the connected conductor layer 604 near one end or a portion of the conductor layer 604 near the other end. Each of four through holes 60T5c is connected to one of the two conductor layers 605 and also connected to a portion of the connected conductor layer 605 near one end or a portion of the conductor layer 605 near the other end.

Figure 5B:
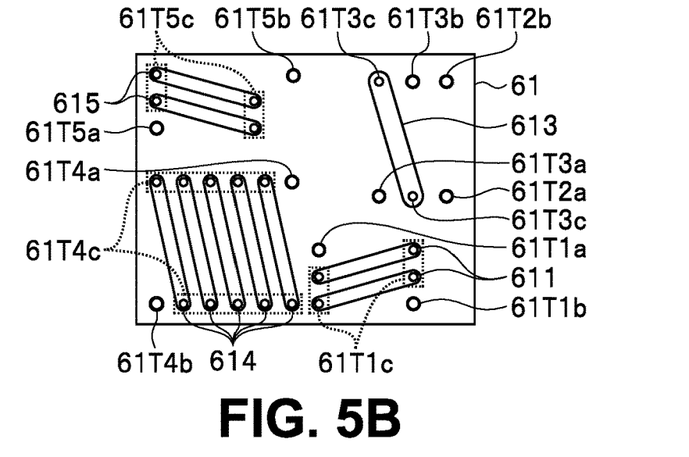
FIG. 5B is an explanatory diagram showing a patterned surface of an eleventh dielectric layer of the stack of the multilayer electronic component according to the embodiment of the present invention.

FIG. 5B shows the patterned surface of the eleventh dielectric layer 61. Two inductor conductor layers 611, one inductor conductor layer 613, five inductor conductor layers 614, and two inductor conductor layers 615 are formed on the patterned surface of the dielectric layer 61.

Ten through holes 61T1a, 61T1b, 61T2a, 61T2b, 61T3a, 61T3b, 61T4a, 61T4b, 61T5a, and 61T5b shown in FIG. 5B are connected to the through holes 60T1a, 60T1b, 60T2a, 60T2b, 60T3a, 60T3b, 60T4a, 60T4b, 60T5a, and 60T5b formed in the dielectric layer 60, respectively.

Each of four through holes 61T1c and each of the four through holes 60T1c formed in the dielectric layer 60 are connected to one of the two conductor layers 611 and also connected to a portion of the connected conductor layer 611 near one end or a portion of the conductor layer 611 near the other end. Each of two through holes 61T3c and each of the two through holes 60T3c formed in the dielectric layer 60 are connected to a portion of the conductor layer 613 near one end or a portion of the conductor layer 613 near the other end.

Each of ten through holes 61T4c and each of the ten through holes 60T4c formed in the dielectric layer 60 are connected to any of the five conductor layers 614 and also connected to a portion of the connected conductor layer 614 near one end or a portion of the conductor layer 614 near the other end. Each of four through holes 61T5c and each of the four through holes 60T5c formed in the dielectric layer 60 are connected to one of the two conductor layers 615 and also connected to a portion of the connected conductor layer 615 near one end or a portion of the connected conductor layer 615 near the other end.

Figure 5C:
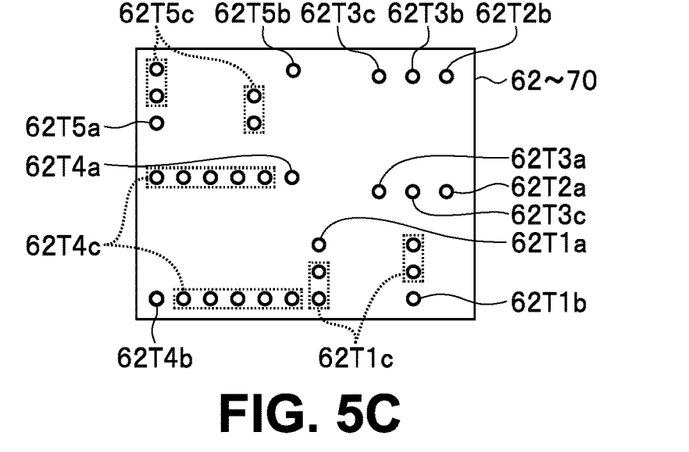
FIG. 5C is an explanatory diagram showing a patterned surface of each of twelfth to twentieth dielectric layers of the stack of the multilayer electronic component according to the embodiment of the present invention.

FIG. 5C shows the patterned surface of each of the twelfth to twentieth dielectric layers 62 to 70. The dielectric layers 68 to 70 each have ten through holes 62T1a, 62T1b, 62T2a, 62T2b, 62T3a, 62T3b, 62T4a, 62T4b, 62T5a, and 62T5b, four through holes 62T1c, two through holes 62T3c, ten through holes 62T4c, and four through holes 62T5c.

The through holes 62T1a, 62T1b, 62T2a, 62T2b, 62T3a, 62T3b, 62T4a, 62T4b, 62T5a, and 62T5b formed in the dielectric layer 62 are connected to the through holes 61T1a, 61T1b, 61T2a, 61T2b, 61T3a, 61T3b, 61T4a, 61T4b, 61T5a, and 61T5b formed in the dielectric layer 61, respectively.

The four through holes 62T1c formed in the dielectric layer 62 are connected to the four respective through holes 61T1c formed in the dielectric layer 61. The two through holes 62T3c formed in the dielectric layer 62 are connected to the two respective through holes 61T3c formed in the dielectric layer 61. The ten through holes 62T4c formed in the dielectric layer 62 are connected to the ten respective through holes 61T4c formed in the dielectric layer 61. The four through holes 62T5c formed in the dielectric layer 62 are connected to the four respective through holes 61T5c formed in the dielectric layer 61.

In the dielectric layers 62 to 70, every vertically adjacent through holes denoted by the same reference signs are connected to each other.

Figure 6A:
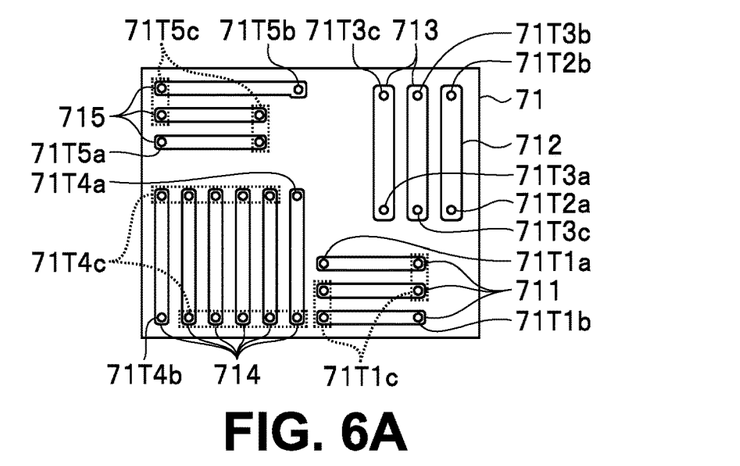
FIG. 6A to FIG. 6C are explanatory diagrams showing respective patterned surfaces of twenty-first to twenty-third dielectric layers of the stack of the multilayer electronic component according to the embodiment of the present invention.

FIG. 6A shows the patterned surface of the twenty-first dielectric layer 71. Three inductor conductor layers 711, one inductor conductor layer 712, two inductor conductor layers 713, six inductor conductor layers 714, and three inductor conductor layers 715 are formed on the patterned surface of the dielectric layer 71.

The through hole 71T1a shown in FIG. 6A and the through hole 62T1a formed in the dielectric layer 70 are connected to a portion of one conductor layer 711 of the three conductor layers 711 near one end. The through hole 71T1b and the through hole 62T1b that is formed in the dielectric layer 70 are connected to a portion of a different conductor layer 711 of the three conductor layers 711 near one end. Each of four through holes 71T1c and each of the four through holes 62T1c formed in the dielectric layer 70 are connected to any of a portion of the one conductor layer 711 near the other end, a portion of the different conductor layer 711 near the other end, a portion of the one remaining conductor layer 711 of the three conductor layers 711 near one end, and a portion of the one remaining conductor layer 711 near the other end.

The through hole 71T2a and the through hole 62T2a are connected to a portion of the conductor layer 712 near one end. The through hole 71T2b and the through hole 62T2b that is formed in the dielectric layer 70 are connected to a portion of the conductor layer 712 near the other end.

The through hole 71T3a and the through hole 62T3c that is formed in the dielectric layer 70 are connected to a portion of one of the two conductor layers 713 near one end. The through hole 71T3b and the through hole 62T3b that is formed in the dielectric layer 70 are connected to a portion of the other one of the two conductor layers 713 near one end. Each of two through holes 71T3c and each of the two through holes 62T3c formed in the dielectric layer 70 are connected to one of a portion of one of the two conductor layers 713 near the other end and a portion of the other one of the two conductor layers 713 near the other end.

The through hole 71T4a and the through hole 62T4a that is formed in the dielectric layer 70 are connected to a portion of one conductor layer 714 of the six conductor layers 714 near one end. The through hole 71T4b and the through hole 62T4b that is formed in the dielectric layer 70 are connected to a portion of a different conductor layer 714 of the six conductor layers 714 near one end. Each of ten through holes 71T4c and each of the ten through holes 62T4c formed in the dielectric layer 70 are connected to any of a portion of the one conductor layer 714 near the other end, a portion of the different conductor layer 714 near the other end, a portion of any of the four remaining conductor layers 714 of the six conductor layers 714 near one end, and a portion of any of the four remaining conductor layers 714 near the other end.

The through hole 71T5a and the through hole 62T5a that is formed in the dielectric layer 70 are connected to a portion of one conductor layer 715 of the three conductor layers 715 near one end. The through hole 71T5b and the through hole 62T5b that is formed in the dielectric layer 70 are connected to a portion of a different conductor layer 715 of the three conductor layers 715 near one end. Each of four through holes 71T5c and each of the four through holes 62T5c formed in the dielectric layer 70 are connected to any of a portion of the one conductor layer 715 near the other end, a portion of the different conductor layer 715 near the other end, a portion of the one remaining conductor layer 715 of the three conductor layers 715 near one end, and a portion of the one remaining conductor layer 715 near the other end.

Figure 6B:
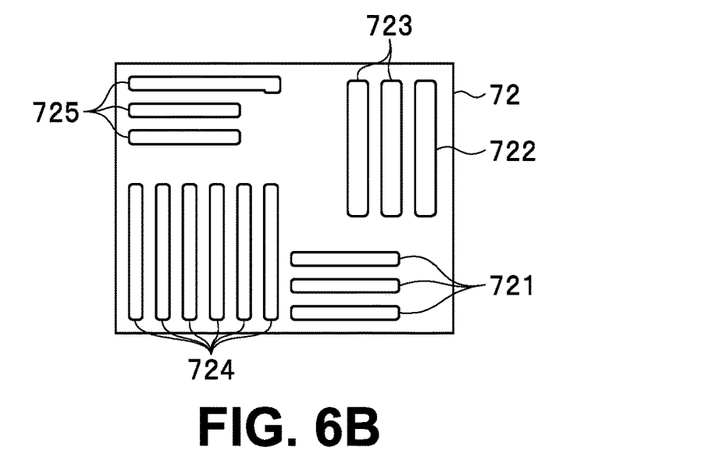

FIG. 6B shows the patterned surface of the twenty-second dielectric layer 72. Three inductor conductor layers 721, one inductor conductor layer 722, two inductor conductor layers 723, six inductor conductor layers 724, and three inductor conductor layers 725 are formed on the patterned surface of the dielectric layer 72.

The through hole 71T1a formed in the dielectric layer 71 is connected to a portion of one conductor layer 721 of the three conductor layers 721 near one end. The through hole 71T1b formed in the dielectric layer 71 is connected to a portion of a different conductor layer 721 of the three conductor layers 721 near one end. Each of four through holes 71T1c formed in the dielectric layer 71 is connected to any of a portion of the one conductor layer 721 near the other end, a portion of the different conductor layer 721 near the other end, a portion of the one remaining conductor layer 721 of the three conductor layers 721 near one end, and a portion of the one remaining conductor layer 721 near the other end.

The through hole 71T2*a* formed in the dielectric layer 71 is connected to a portion of the conductor layer 722 near one end. The through hole 71T2*b* formed in the dielectric layer 71 is connected to a portion of the conductor layer 722 near the other end.

The through hole 71T3*a* formed in the dielectric layer 71 is connected to a portion of one of the two conductor layers 723 near one end. The through hole 71T3*b* formed in the dielectric layer 71 is connected to a portion of the other one of the two conductor layers 723 near one end. Each of two through holes 71T3*c* formed in the dielectric layer 71 is connected to one of a portion of one of the two conductor layers 723 near the other end and a portion of the other one of the two conductor layers 723 near the other end.

The through hole 71T4*a* formed in the dielectric layer 71 is connected to a portion of one conductor layer 724 of the six conductor layers 724 near one end. The through hole 71T4*b* formed in the dielectric layer 71 is connected to a portion of a different conductor layer 724 of the six conductor layers 724 near one end. Each of ten through holes 71T4*c* formed in the dielectric layer 71 is connected to any of a portion of the one conductor layer 724 near the other end, a portion of the different conductor layer 724 near the other end, a portion of any of the four remaining conductor layers 724 of the six conductor layers 724 near one end, and a portion of any of the four remaining conductor layers 724 near the other end.

The through hole 71T5*a* formed in the dielectric layer 71 is connected to a portion of one conductor layer 725 of the three conductor layers 725 near one end. The through hole 71T5*b* formed in the dielectric layer 71 is connected to a portion of a different conductor layer 725 of the three conductor layers 725 near one end. Each of four through holes 71T5*c* formed in the dielectric layer 71 is connected to any of a portion of the one conductor layer 725 near the other end, a portion of the different conductor layer 725 near the other end, a portion of the one remaining conductor layer 725 of the three conductor layers 725 near one end, and a portion of the one remaining conductor layer 725 near the other end.

Figure 6C:
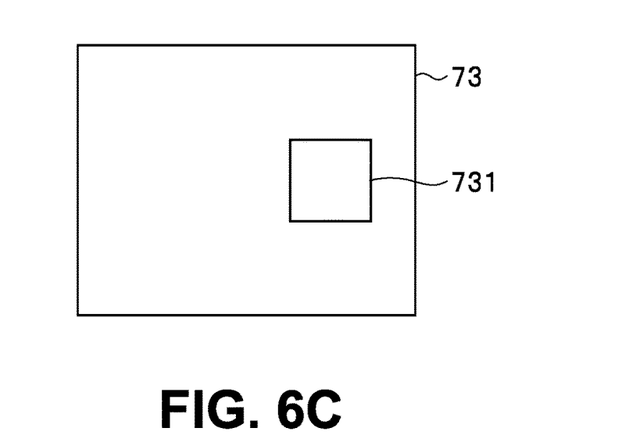

FIG. 6C shows the patterned surface of the twenty-third dielectric layer 73. A mark 731 is formed on the patterned surface of the dielectric layer 73.

The stack 50 shown in FIG. 2 is formed by stacking the first to twenty-third dielectric layers 51 to 73 such that the patterned surface of the first dielectric layer 51 serves as the bottom surface 50A of the stack 50 and the surface of the twenty-third dielectric layer 73 opposite to the patterned surface thereof serves as the top surface 50B of the stack 50.

Each of the plurality of through holes shown in FIG. 3A to FIG. 6A is connected to, when the first to twenty-second dielectric layers 51 to 72 are stacked, a conductor layer overlapping in the stacking direction T or to another through hole overlapping in the stacking direction T. Of the plurality of through holes shown in FIG. 3A to FIG. 6A, the ones located within a terminal or a conductor layer are connected to the terminal or conductor layer.

Figure 7:
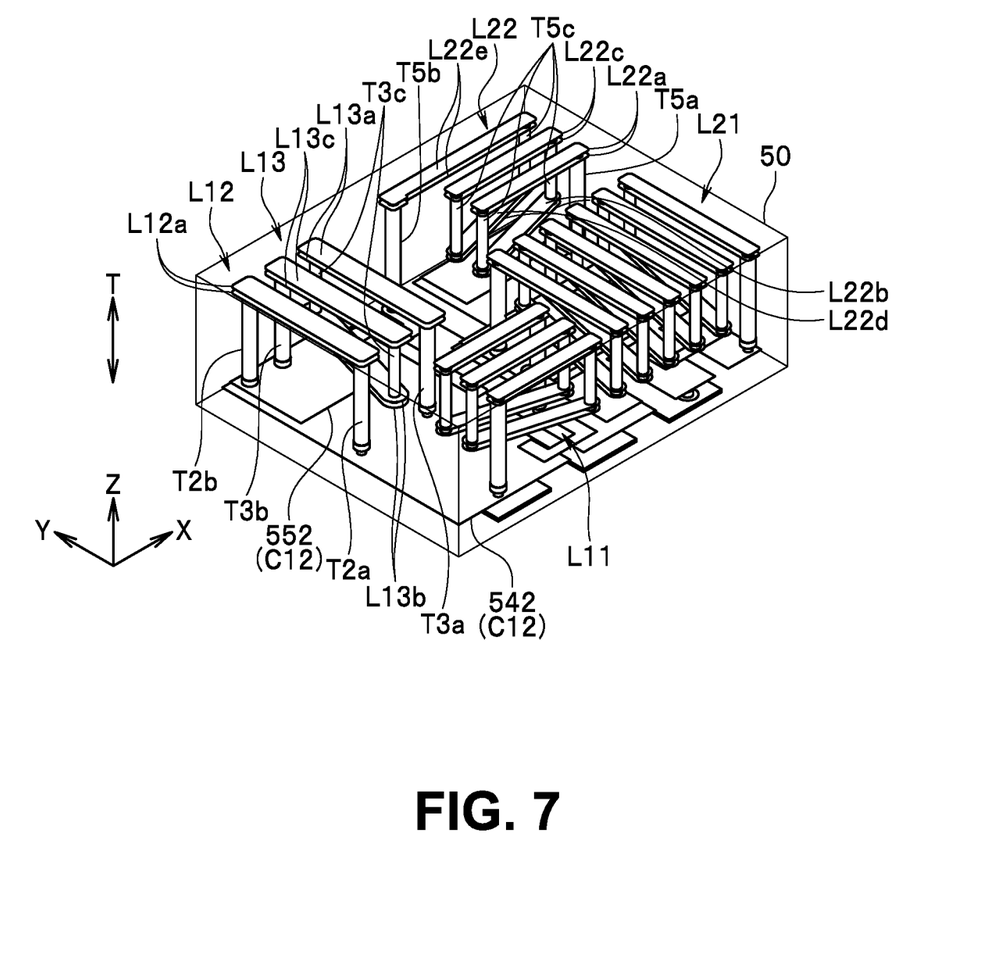
FIG. 7 is a perspective view showing the inside of the stack of the multilayer electronic component according to the embodiment of the present invention.

FIG. 7 shows the inside of the stack 50 formed by stacking the first to twenty-third dielectric layers 51 to 73. As shown in FIG. 7, the plurality of conductor layers and the plurality of through holes shown in FIG. 3A to FIG. 6B are stacked together inside the stack 50. In FIG. 7, the mark 731 is omitted.

Correspondences between the circuit components of the electronic component 1 shown in FIG. 1 and the internal components of the stack 50 shown in FIG. 3A to FIG. 6B will now be described. Components of the first filter 10 will initially be described. The inductor L11 is composed of the conductor layers 601, 611, 711, and 721, the through holes 54T1*a*, 55T1*a*, 56T1*a*, 60T1*a*, 61T1*a*, 62T1*a*, and 71T1*a*, the through holes 54T1*b*, 55T1*b*, 56T1*b*, 60T1*b*, 61T1*b*, 62T1*b*, and 71T1*b*, and the through holes 60T1*c*, 61T1*c*, 62T1*c*, and 71T1*c*.

The inductor L12 is composed of the conductor layers 712 and 722, the through holes 54T2*a*, 55T2*a*, 56T2*a*, 60T2*a*, 61T2*a*, 62T2*a*, and 71T2*a*, and the through holes 55T2*b*, 56T2*b*, 60T2*b*, 61T2*b*, 62T2*b*, and 71T2*b*.

The inductor L13 is composed of the conductor layers 603, 613, 713, and 723, the through holes 54T3*a*, 55T3*a*, 56T3*a*, 60T3*a*, 61T3*a*, 62T3*a*, and 71T3*a*, the through holes 55T3*b*, 56T3*b*, 60T3*b*, 61T3*b*, 62T3*b*, and 71T3*b*, and the through holes 60T3*c*, 61T3*c*, 62T3*c*, and 71T3*c*.

The capacitor C11 is composed of the conductor layers 541, 542, and 551 and the dielectric layer 54 interposed between two of those conductor layers. The capacitor C12 is composed of the conductor layers 542 and 552 and the dielectric layer 54 interposed between those conductor layers. The capacitor C13 is composed of the conductor layers 531 and 542 and the dielectric layer 53 interposed between those conductor layers.

Next, components of the second filter 20 will be described. The inductor L21 is composed of the conductor layers 604, 614, 714, and 724, the through holes 54T4*a*, 55T4*a*, 56T4*a*, 60T4*a*, 61T4*a*, 62T4*a*, and 71T4*a*, the through holes 54T4*b*, 55T4*b*, 56T4*b*, 60T4*b*, 61T4*b*, 62T4*b*, and 71T4*b*, and the through holes 60T4*c*, 61T4*c*, 62T4*c*, and 71T4*c*.

The inductor L22 is composed of the conductor layers 605, 615, 715, and 725, the through holes 54T5*a*, 55T5*a*, 56T5*a*, 60T5*a*, 61T5*a*, 62T5*a*, and 71T5*a*, the through holes 52T5*b*, 53T5*b*, 54T5*b*, 55T5*b*, 56T5*b*, 60T5*b*, 61T5*b*, 62T5*b*, and 71T5*b*, and the through holes 60T5*c*, 61T5*c*, 62T5*c*, and 71T5*c*.

The capacitor C21 is composed of the conductor layers 541 and 553 and the dielectric layer 54 interposed between those conductor layers. The capacitor C22 is composed of the conductor layers 532 and 543 and the dielectric layer 53 interposed between those conductor layers. The capacitor C23 is composed of the conductor layers 533 and 544 and the dielectric layer 53 interposed between those conductor layers. The capacitor C24 is composed of the conductor layers 533 and 545 and the dielectric layer 53 interposed between those conductor layers.

The capacitor C25 is composed of the conductor layers 546 and 554 and the dielectric layer 54 interposed between those conductor layers. The capacitor C27 is composed of the conductor layers 547 and 554 and the dielectric layer 54 interposed between those conductor layers.

Figure 8:
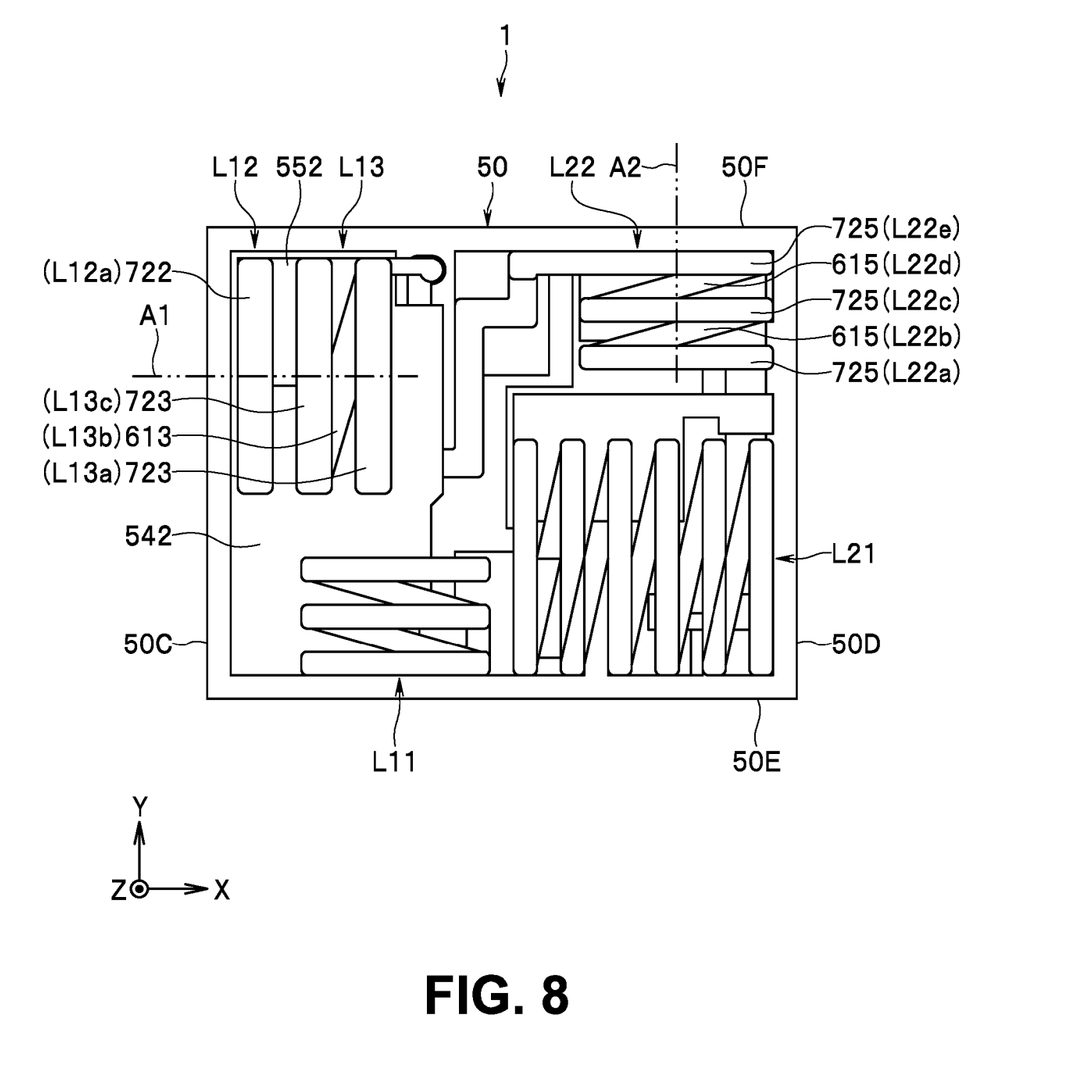
FIG. 8 is a plan view showing the inside of the stack of the multilayer electronic component according to the embodiment of the present invention.

Next, structural features of the electronic component 1 according to the present embodiment will be described with reference to FIG. 1, FIG. 7, and FIG. 8. FIG. 8 is a plan view showing the inside of the stack 50.

As shown in FIG. 7 and FIG. 8, each of the inductors L12 and L13 is wound about an axis A1 extending in a direction orthogonal to the stacking direction T. In the present embodiment, in particular, the axis A1 extends in a direction parallel to the X direction. An opening of the inductor L12 and an opening of the inductor L13 face each other.

Note that the inductors L12 and L13 may be wound about the same axis A1 as shown in FIG. 8. Alternatively, a first axis about which the inductor L12 is wound and a second axis about which the inductor L13 is wound may be different from each other. In this case, the first axis and the second axis may or may not be in parallel but need not be in parallel.

The number of windings of the inductor L12 and the number of windings of the inductor L13 are different from each other. In the example shown in FIG. 7 and FIG. 8, each of the inductors L12 and L13 is a rectangular coil. For a rectangular coil, the number of windings may be counted as a ¼ winding per side of the rectangle. The number of windings of the inductor L12 is ¾. The number of windings of the inductor L13 is 7/4.

The inductor L12 includes one conductor layer portion L12a and two through hole lines T2a and T2b. The conductor layer portion L12a is composed of the two conductor layers 712 and 722 connected to each other via the through holes 71T2a and 71T2b. The through hole line T2a is constituted by connecting the through holes 54T2a, 55T2a, 56T2a, 60T2a, 61T2a, 62T2a, and 71T2a in series. The through hole line T2b is constituted by connecting the through holes 55T2b, 56T2b, 60T2b, 61T2b, 62T2b, and 71T2b in series. The conductor layer portion L12a and the through hole lines T2a and T2b are connected in the order of the through hole line T2a, the conductor layer portion L12a, and the through hole line T2b to circle around the axis A1.

The inductor L13 includes three conductor layer portions L13a, L13b, and L13c, two through hole lines T3a and T3b, and two through hole lines T3c. The conductor layer portion L13a is composed of the two conductor layers 713 and 723 connected to each other via the through holes 71T3a and 71T3c. The conductor layer portion L13b is composed of the two conductor layers 603 and 613 connected to each other via the two through holes 60T3c. The conductor layer portion L13c is composed of the two conductor layers 713 and 723 connected to each other via the through holes 71T3b and 71T3c.

The through hole line T3a is constituted by connecting the through holes 54T3a, 55T3a, 56T3a, 60T3a, 61T3a, 62T3a, and 71T3a in series. The through hole line T3b is constituted by connecting the through holes 55T3b, 56T3b, 60T3b, 61T3b, 62T3b, and 71T3b in series. Each of the two through hole lines T3c is constituted by connecting the through holes 60T3c, 61T3c, 62T3c, and 71T3c in series.

The conductor layer portions L13a to L13c and the through hole lines T3a to T3c are connected in the order of the through hole line T3a, the conductor layer portion L13a, one of the two through hole lines T3c, the conductor layer portion L13b, the other of the two through hole lines T3c, the conductor layer portion L13c, and the through hole line T3b to circle around the axis A1.

The capacitor C12 is connected in parallel with the inductors L12 and L13 as shown in FIG. 1. The through hole line T2a of the inductor L12 and the through hole line T3a of the inductor L13 are connected to the conductor layer 542 composing the capacitor C12. The through hole line T2b of the inductor L12 and the through hole line T3b of the inductor L13 are connected to the conductor layer 552 composing the capacitor C12. The conductor layer portions L12a and L13a to L13c overlap the conductor layers 542 and 552 when seen from the direction parallel to the stacking direction T.

As shown in FIG. 7 and FIG. 8, the inductors L12 and L13 are arranged in this order in the X direction. The inductor L22 is arranged forward of the inductors L12 and L13 in a direction of the inductors L12 and L13 being arranged (in the X direction). As shown in FIG. 7 and FIG. 8, the inductor L22 is wound about an axis A2 extending in a direction orthogonal to the stacking direction T. In the present embodiment, in particular, the axis A2 extends in a direction parallel to the Y direction. An opening of the inductor L22 does not face an opening of each of the inductors L12 and L13.

The inductor L22 is a rectangular coil. The number of windings of the inductor L22 is 11/4.

The inductor L22 includes five conductor layer portions L22a, L22b, L22c, L22d, and L22e, the two through hole lines T5a and T5b, and four through hole lines T5c. The conductor layer portion L22a is composed of the two conductor layers 715 and 725 connected to each other via the through holes 71T5a and 71T5c. The conductor layer portion L22b is composed of the two conductor layers 603 and 613 connected to each other via the two through holes 60T5c. The conductor layer portion L22c is composed of the two conductor layers 715 and 725 connected to each other via the two through holes 71T5c. The conductor layer portion L22d is composed of the two other conductor layers 603 and 613 connected to each other via the two other through holes 60T5c. The conductor layer portion L22e is composed of the two conductor layers 715 and 725 connected to each other via the through holes 71T5b and 71T5c.

The through hole line T5a is constituted by connecting the through holes 54T5a, 55T5a, 56T5a, 60T5a, 61T5a, 62T5a, and 71T5a in series. The through hole line T5b is constituted by connecting the through holes 52T5b, 53T5b, 54T5b, 55T5b, 56T5b, 60T5b, 61T5b, 62T5b, and 71T5b in series. Each of the four through hole lines T5c is constituted by connecting the through holes 60T5c, 61T5c, 62T5c, and 71T5c in series.

The conductor layer portions L22a to L22e and the through hole lines T5a to T5c are connected in the order of the through hole line T5a, the conductor layer portion L22a, the through hole line T5c, the conductor layer portion L22b, the through hole line T5c, the conductor layer portion L22c, the through hole line T5c, the conductor layer portion L22d, the through hole line T5c, the conductor layer portion L22e, and the through hole line T5b to circle around the axis A2.

Now, the operation and effects of the electronic component 1 according to the present embodiment will be described. In the present embodiment, the inductors L12 and L13 provided to the first filter 10 are connected in parallel with each other. The number of windings of the inductor L12 and the number of windings of the inductor L13 are different from each other. Thus, according to the present embodiment, it is possible to achieve desired characteristics while increasing a Q value. This effect will be described in detail below with reference to simulation results.

The simulation used a model of a comparative example and a model of a practical example. The model of the comparative example is a model of an electronic component according to the comparative embodiment. The electronic component of the comparative example has the same configuration as that of the electronic component 1 according to the present embodiment excluding that the inductor L13 is not provided. The model of the practical example is a model of the electronic component 1 according to the present embodiment.

In the simulation, the model of the comparative example and the model of the practical example were designed so that an upper limit frequency of the first passband of the first filter 10 would be 2.2 GHz and a lower limit frequency of the second passband of the second filter 20 would be 2.3 GHz. Then, for each of the model of the comparative example and the model of the practical example, pass attenuation characteristics between the first port 2 and the second port 3 and pass attenuation characteristics between the first port 2 and the third port 4 were obtained. In addition, the Q value of the inductor L12 in the model of the comparative example and the Q value of a parallel circuit part formed of the inductors L12 and L13 in the model of the practical example were obtained.

Figure 9:
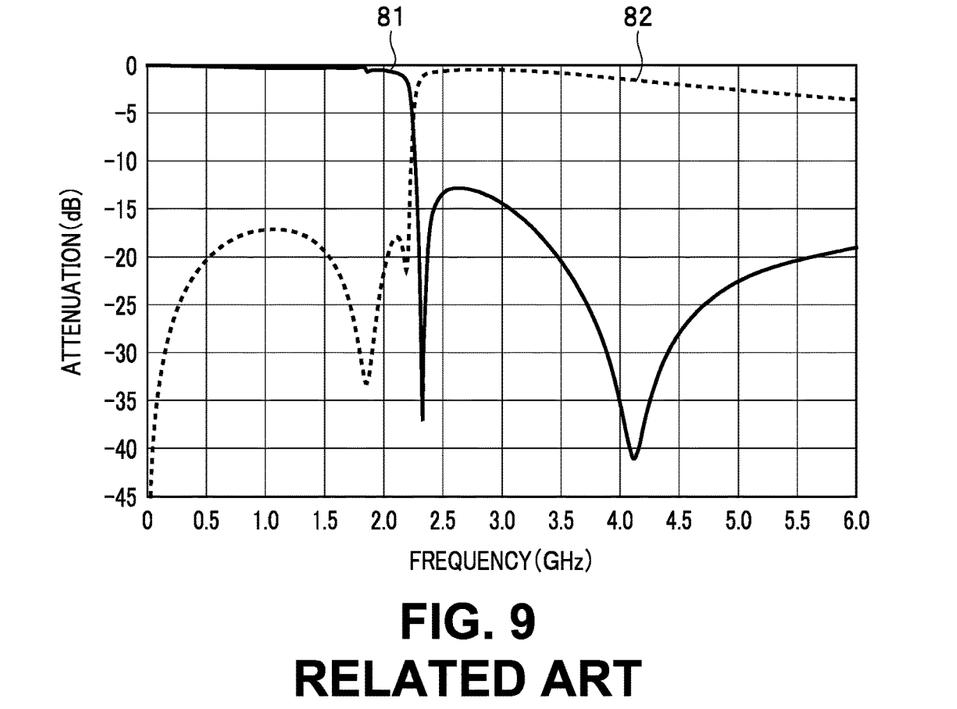
FIG. 9 is a characteristic chart showing pass attenuation characteristics of a model of a comparative example.
Figure 10:
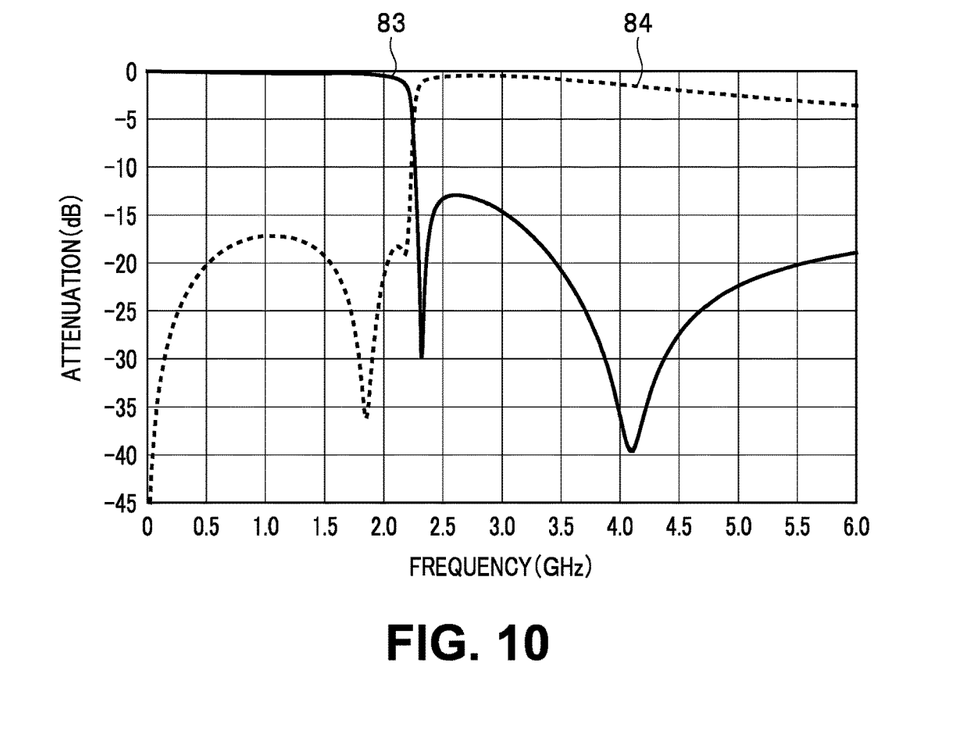
FIG. 10 is a characteristic chart showing pass attenuation characteristics of a model of a practical example.

FIG. 9 is a characteristic chart showing pass attenuation characteristics of the model of the comparative example. FIG. 10 is a characteristic chart showing pass attenuation characteristics of the model of the practical example. In FIG. 9 and FIG. 10, the horizontal axis represents frequency, and the vertical axis represents attenuation. In FIG. 9, a reference numeral 81 denotes the pass attenuation characteristics between the first port 2 and the second port 3, and a reference numeral 82 denotes the pass attenuation characteristics between the first port 2 and the third port 4. In FIG. 10, a reference numeral 83 denotes the pass attenuation characteristics between the first port 2 and the second port 3, and a reference numeral 84 denotes the pass attenuation characteristics between the first port 2 and the third port 4.

In the model of the comparative example, the amount of insertion loss (absolute value of attenuation) at the upper limit frequency of the first passband was 1.76 dB. In the model of the practical example, the amount of insertion loss at the upper limit frequency of the first passband was 1.66 dB. The Q value of the inductor L12 in the model of the comparative example was 67, and the Q value of the parallel circuit part formed of the inductors L12 and L13 in the model of the practical example was 77. As understood from the results of the simulation, according to the present embodiment, it is possible to achieve characteristics sufficient as a low-pass filter for the first filter 10 while increasing a Q value.

Note that, in the simulation, the second filter 20 had sufficient characteristics as a high-pass filter in each of the model of the comparative example and the model of the practical example.

Now, other effects of the present embodiment will be described. As described above, in the present embodiment, the capacitor C12 is connected in parallel with the inductors L12 and L13. The conductor layer portion L12a of the inductor L12 and the conductor layer portions L13a to L13c of the inductor L13 overlap the conductor layers 542 and 552 composing the capacitor C12, when seen from the direction parallel to the stacking direction T. In the present embodiment, the space in the stack 50 is thus used efficiently to downsize the electronic component 1.

As described above, in the present embodiment, the inductor L22 is arranged forward of the inductors L12 and L13 in a direction of the inductors L12 and L13 being arranged (in the X direction). When the electronic component 1 is downsized, electromagnetic coupling between the inductors L12 and L13 and the inductor L22 may be too strong to achieve desired characteristics, for example, isolation between the second port 3 and the third port 4 decreases, and the like. To address this, in the present embodiment, the inductor L22 is arranged so that the opening of the inductor L22 does not face the opening of each of the inductors L12 and L13. Thus, according to the present embodiment, it is possible to efficiently use the space in the stack 50 while achieving desired characteristics, to consequently downsize the electronic component 1.

In the present embodiment, the parallel circuit part formed of the inductors L12 and L13 substitutes an inductor having a relatively low inductance. Thus, according to the present embodiment, it is possible to downsize the electronic component 1 by reducing the number of windings of each of the inductors L12 and L13. Note that, in some configurations of the electronic component 1, a parallel circuit part having a similar configuration to that of the parallel circuit part formed of the inductors L12 and L13 may be used as a substitution of an inductor having a relatively high inductance, in other words, an inductor having a relatively large number of windings.

The present invention is not limited to the foregoing embodiment, and various modifications may be made thereto. For example, an electronic component of the present invention may be an electronic component including only the first filter 10, may be an electronic component including a resonant circuit other than a low-pass filter including the inductors L12 and L13, or may be an electronic component including only the inductors L12 and L13.

The second filter 20 may include a parallel circuit part having a similar configuration to that of the parallel circuit part formed of the inductors L12 and L13.

As described above, a multilayer electronic component of the present invention includes: a first inductor; a second inductor connected in parallel with the first inductor; and a stack for integrating the first inductor and the second inductor, the stack including a plurality of dielectric layers stacked together. Each of the first inductor and the second inductor is wound about an axis extending in a direction orthogonal to the stacking direction of the plurality of dielectric layers. The number of windings of the first inductor and the number of windings of the second inductor are different from each other.

In the multilayer electronic component according to the present invention, each of the first inductor and the second inductor may include at least one conductor layer portion and a plurality of through hole lines. Each of the plurality of through hole lines may be constituted by connecting two or more through holes in series. The at least one conductor layer portion and the plurality of through hole lines may be alternately connected to circle around the axis.

In the multilayer electronic component of the present invention, an opening of the first inductor and an opening of the second inductor may face each other.

The multilayer electronic component of the present invention may further include a first signal terminal, a second signal terminal, and a signal path connecting the first signal terminal and the second signal terminal. Both ends of each of the first inductor and the second inductor may be connected to the signal path.

The multilayer electronic component of the present invention may further include a low-pass filter including the first inductor and the second inductor.

The multilayer electronic component of the present invention may further include a capacitor connected in parallel with each of the first inductor and the second inductor. In this case, each of the first inductor and the second inductor may include at least one conductor layer portion and a plurality of through hole lines. Each of the plurality of through hole lines may be constituted by connecting two or more through holes in series. The at least one conductor layer portion and the plurality of through hole lines may be alternately connected to circle around the axis. The capacitor may include a capacitor conductor layer. At least one conductor layer portion of each of the first inductor and the second inductor may overlap the capacitor conductor layer when seen from a direction parallel with the stacking direction.

The multilayer electronic component of the present invention may further include a third inductor wound about another axis extending in a direction orthogonal to the stacking direction. The third inductor may be arranged forward of the first inductor and the second inductor in a direction of the first inductor and the second inductor being arranged. An opening of the third inductor may not face the opening of the first inductor and the opening of the second inductor.

Obviously, many modifications and variations of the present invention are possible in the light of the above teachings. Thus, it is to be understood that, within the scope of the appended claims and equivalents thereof, the present invention may be practiced in other embodiments than the foregoing most preferable embodiment.

What is claimed is:

1. A multilayer electronic component comprising:
a first inductor;
a second inductor connected in parallel with the first inductor; and
a stack for integrating the first inductor and the second inductor, the stack including a plurality of dielectric layers stacked together, wherein
each of the first inductor and the second inductor is wound about an axis extending in a direction orthogonal to a stacking direction of the plurality of dielectric layers,
a number of windings of the first inductor and a number of windings of the second inductor are different from each other,
each of the first inductor and the second inductor includes at least one conductor layer portion and a plurality of through hole lines,
each of the plurality of through hole lines is constituted by connecting two or more through holes in series,
the at least one conductor layer portion and the plurality of through hole lines are alternately connected to circle around the axis,
the at least one conductor layer portion of the first inductor includes a first conductor layer,
the at least one conductor layer portion of the second inductor includes a second conductor layer, and
the first conductor layer and the second conductor layer are arranged at a same position in the stacking direction.

2. The multilayer electronic component according to claim 1, further comprising:
a first signal terminal;
a second signal terminal; and
a signal path connecting the first signal terminal and the second signal terminal, wherein
two ends of each of the first inductor and the second inductor are connected to the signal path.

3. The multilayer electronic component according to claim 1,
wherein an opening of the first inductor and an opening of the second inductor face each other.

4. The multilayer electronic component according to claim 1, further comprising
a capacitor connected in parallel with each of the first inductor and the second inductor.

5. The multilayer electronic component according to claim 4, wherein
each of the first inductor and the second inductor includes at least one conductor layer portion and a plurality of through hole lines,
each of the plurality of through hole lines is constituted by connecting two or more through holes in series,
the at least one conductor layer portion and the plurality of through hole lines are alternately connected to circle around the axis,
the capacitor includes a capacitor conductor layer, and
the at least one conductor layer portion of each of the first inductor and the second inductor overlaps the capacitor conductor layer when seen from a direction parallel with the stacking direction.

6. A multilayer electronic component comprising:
a first inductor;
a second inductor connected in parallel with the first inductor;
a low-pass filter including the first inductor and the second inductor; and
a stack for integrating the first inductor and the second inductor, the stack including a plurality of dielectric layers stacked together, wherein
each of the first inductor and the second inductor is wound about an axis extending in a direction orthogonal to a stacking direction of the plurality of dielectric layers, and
a number of windings of the first inductor and a number of windings of the second inductor are different from each other.

7. A multilayer electronic component comprising:
a first inductor;
a second inductor connected in parallel with the first inductor;
a third inductor; and
a stack for integrating the first inductor, the second inductor, and the third inductor, the stack including a plurality of dielectric layers stacked together, wherein
each of the first inductor and the second inductor is wound about an axis extending in a direction orthogonal to a stacking direction of the plurality of dielectric layers,
a number of windings of the first inductor and a number of windings of the second inductor are different from each other,
the third inductor is wound about another axis extending in a direction orthogonal to the stacking direction,
the third inductor is arranged forward of the first inductor and the second inductor in a direction of the first inductor and the second inductor being arranged, and
an opening of the third inductor does not face an opening of the first inductor and an opening of the second inductor.

* * * * *